(12) United States Patent
Tsai et al.

(10) Patent No.: US 9,087,173 B2
(45) Date of Patent: Jul. 21, 2015

(54) DETERMINING PROXIMITY EFFECT PARAMETERS FOR NON-RECTANGULAR SEMICONDUCTOR STRUCTURES

(75) Inventors: Kuen-Yu Tsai, Taipei (TW); Meng-Fu You, Changhua (TW); Yi-Chang Lu, Linkou Township, Taipei County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 263 days.

(21) Appl. No.: 12/909,506

(22) Filed: Oct. 21, 2010

(65) Prior Publication Data

US 2011/0178778 A1    Jul. 21, 2011

Related U.S. Application Data

(60) Provisional application No. 61/253,544, filed on Oct. 21, 2009.

(51) Int. Cl.
G06F 17/10 (2006.01)
G06F 17/50 (2006.01)

(52) U.S. Cl.
CPC .................. *G06F 17/5081* (2013.01)

(58) Field of Classification Search
USPC .................. 703/13, 14; 716/53, 54
See application file for complete search history.

(56) References Cited

U.S. PATENT DOCUMENTS

| | | | |
|---|---|---|---|
| 8,037,575 B2 * | 10/2011 | Cheng et al. | 16/54 |
| 8,151,240 B2 * | 4/2012 | Agarwal et al. | 716/136 |
| 2005/0114822 A1 | 5/2005 | Axelrad et al. | |

OTHER PUBLICATIONS

Singhal et al., "Modeling and Analysis of Non-Rectangular Gate for Post-Lithography Circuit Simulation", ACM/IEEE Design Automation Conference, Jun. 2007, pp. 823-828.*
Sreedhar et al., "On modeling impact of sub-wavelength lithography on transistors", International Conference on Computer Design, Oct. 2007, pp. 84-90.*
Sreedhar et al., "Modeling and Analysis of Non-Rectangular Transistors Caused by Lithographic Distortions", International Conference on Computer Design, Oct. 2008, pp. 444-449.*
Tsai et al., "A New Method to Improve Accuracy of Leakage Current Estimation for Transistors with Non-Rectangular Gates due to Sub-wavelength Lithography Effects", International Conference on Computer-Aided Design, Nov. 2008, pp. 286-291.*
Wuu et al., "Fast and simple modeling of non-rectangular transistors", Proc. SPIE 7122, Photomask Technology 2008, 71223S, Oct. 2008, 9 pages.*
Chun-Hung Lin et al., "A Novel Curve-Fitting Procedure for Determining Proximity Effect Parameters in Electron Beam Lithography", Lithography Asia 2008, edited by Alek C. Chen, Burn Lin, Anthony Yen, Proc. of SPIE vol. 7140, 71401I, © SPIE—CCC code: 0277-786X/08, 10 pages.

(Continued)

*Primary Examiner* — Omar Fernandez Rivas
*Assistant Examiner* — Herng-Der Day
(74) *Attorney, Agent, or Firm* — Haynes and Boone, LLP (57) ABSTRACT

The present disclosure relates to a curve-fitting procedure for determining proximity effect device parameters in semiconductor fabrication. Methods presented herein are adapted to determine the impact of narrow width related edge effects on device characteristics by comparing two-dimensional (2D) and/or three-dimensional (3D) device simulations. Methods presented herein are adapted to determine the accuracy of conventional extraction methods utilizing non-rectangular gate device simulation.

20 Claims, 6 Drawing Sheets

(56) References Cited

OTHER PUBLICATIONS

Kuen-Yu Tsai et al., "A New Method to Improve Accuracy of Leakage Current Estimation for Transistors with Non-Rectangular Gates Due to Sub-Wavelength Lithography Effects", IEEE Xplore, Jan. 13, 2009, 6 pages.

Chun-Hung Li et al., "A Novel Curve-Fitting Procedure for Determining Proximity Effect Parameters in Electron Beam Lithography", Power Point Presentation, Nov. 5, 2008, 12 pages.

Kuen-Yu Tsai et al., "A New Method to Improve Accuracy of Leakage Current Estimation for Transistors with Non-Rectangular Gates Due to Sub-Wavelength Lithography Effects", Power Point Presentation, Nov. 10, 2008, 47 pages.

G. E. Moore, *Cramming More Components Onto Integrated Circuits*, Electronics, pp. 114-117, 1965.

E. Seevinck, F. List, and J. Lohstroh, Static-noise margin analysis of MOS SRAM cells, IEEE J. Solid-State Circuits, vol. SC-22, pp. 748-754, 1987.

A. Balasinski, H. Gangala, V. Axelrad, and V. Boksha, A Novel Approach to Simulate the Effect of Optical Proximity on MOSFET Parametric Yield, in Electron Devices Meeting, IEDM Technical Digest, pp. 913-916, 1999.

A. Balasinski, L. Karklin, and V. Axelrad, Impact of subwavelength CD tolerance on device performance, in Proceedings of SPIE, Design, Process Integration and Characterization for Microelectronics, vol. 4692, pp. 361-368, 2002.

L. Karklin, S. Mazor, D. Joshi, A. Balasinski, and V. Axelrad, Subwavelength lithography—An impact of photo mask errors on circuit performance, in Proceedings of SPIE, Optical Microlithography, vol. 4691, pp. 259-267, 2002.

F. Arnaud, F. Boeuf, F. Salvetti, D. Lenoble, F. Wacquant, et al., A Functional 0.69μm2 Embedded 6T-SRAM bit cell for 65nm CMOS platform, in Symposium on VLSI Technology, pp. 55-56, 2003.

A. Balasinski, A methodology to analyze circuit impact of process related MOSFET geometry, in Proceedings of the SPIE, Design and Process Integration for Microelectronic Manufacturing, vol. 5379, pp. 85-92, 2004.

C. Pacha, M. Bach, K. V. Arnim, R. Brederlow, D. S. Lansiedel, P. Seegebrecht, J. Berthold, and R. Thewes, Impact of STI-Induced Stress, Inverse Narrow Width Effect, and Statistical VTH Variations on Leakage Current in J 20nm CMOS, Solid-State Device Research Conference, Proceeding of the 34th European, pp. 397-400, 2004.

S. D. Kim, H. Wada and J. C. S. Woo, TCAD-Based Statistical Analysis and Modeling of Gate Line-Edge Roughness Effect on Nanoscale MOS Transistor Performance and Scaling, IEEE Transactions on Semiconductor Manufacturing, vol. 17, No. 2, May 2004.

ISE TCAD Release 10.0 User's Manual, 2004.

A. Shibkov, V. Axelrad, Integrated Simulation Flow for Self-Consistent Manufacturability and Circuit Performance Evaluation, in Simulation of Semiconductor Processes and Device International Conference, IEEE, 2005.

I. Polishchuk, N. Mathur, C. Sandstrom, P. Manos, 0. Pohland, CMOS Vt-Control Improvement Through Implant Lateral Scatter Elimination, Semiconductor Manufacturing, IEEE International Symposium, pp. 193-196, 2005.

V. Axelrad, A Shibkov, A novel design-process optimization technique based on self-consistent electrical performance evaluation, in Proceedings of SPIE, Design and Process Integration for Microelectronic Manufacturing, vol. 5756, pp. 419-426, May 2005.

Y. Trouiller, T. Devoivre, J. Belledent, et al, 65nm OPC and design optimization by using simple electrical transistor simulation, in Proceedings of SPIE vol. 5756, pp. 378-388, Design and Process Integration for Microelectronic Manufacturing, 2005.

S. Mukhopadhyay, H. Mahmoodi, K. Roy, Modeling of failure probability and statistical design of SRAM array for yield enhancement in nanoscale CMOS, IEEE Transactions on Computer-Aided Design, pp. 1859-1880, 2005.

K. Koike, K. Nakayama, K. Ogawa, and H. Ohnuma, Optimization of layout design and OPC by using estimation of transistor properties, in Proceeding of SPIE, Photomask and Next-Generation Lithography Mask Technology, vol. 6283, 2006.

W. J. Poppe, L. Capodieci, J. Wu, and A. Neureuther, From poly line to transistor building BSIM models for non-rectangular transistors, in Proceeding of SPIE vol. 6156, Design and Process Integration for Microelectronic Manufacturing, 2006.

S. Saumil, P. Gupta, A. Kahng, Y. Kim, and D. Sylvester, Modeling of Non-Uniform Device Geometries for Post-Lithography Circuit Analysis, in Proceedings of SPIE vol. 6156, Design and Process Integration for Microelectronic Manufacturing, 2006.

S. X. Shi, P. Yu, and D. Z. Pan, A Unified Non-Rectangular Device and Circuit Simulation Model for Timing and Power, ICCAD, pp. 423-428, 2006.

M. F. You, Philip CW Ng, Y. S. Su, K. Y. Tsai and Y. C. Lu., Impact of optical correction settings on electrical performances. in Proceedings of SPIE vol. 6521, Design for Manufacturability through Design-Process Integration, 2007.

R. Singhal, et al, Modeling and Analysis of Non-Rectangular Gate for Post-Lithography Circuit Simulation, DAC, 2007.

Y. Cao et al., Predictive Technology Model website, available at http://www.eas.asu.edu/~ptm/, 2011.

Wikipedia, photo lithography article, available at http://en.wikipedia.org/wiki/Photolithography, 2013.

Synopsys company, Proteus, Progen Prospector Full-Chip Optical Proximity Correction, available at http://www.synopsys.com/products/avmrg/proteus_ds.html, 2004.

\* cited by examiner

DETERMINING PROXIMITY EFFECT PARAMETERS FOR NON-RECTANGULAR SEMICONDUCTOR STRUCTURES

RELATED APPLICATIONS

This application claims the benefit to U.S. Provisional Application Ser. No. 61/253,544 entitled, "Equivalent Device Extraction Method and Novel Curve-Fitting Procedure for Determining Proximity Effect Parameters in Electron Beam Lithography," filed Oct. 21, 2009, which is hereby incorporated by reference in its entirety.

BACKGROUND

The critical dimension (CD) of integrated circuits has decreased to sub-wavelength conditions for optical lithography, wherein the critical dimension of integrated circuits is close to or smaller than the exposure wavelength. Under these sub-wavelength conditions, wafer pattern distortion caused by lithographic process variations, such as lens aberration, misalignment, defocus, overexposure, optical diffraction, and polarization, have an impact on reliability and performance due to line-end shortening, corner-rounding, and line-edge roughness of integrated circuit patterns. To overcome the deficiencies of proximity effect distortion, resolution enhancement techniques may be utilized. However, in some instances, the manufacturing of nanometer transistor devices may be subjected to serious gate shape pattern distortion. Some electrical characteristics of transistor devices, such as threshold voltage and leakage current, may be seriously affected by sub-wavelength gate sizes and shapes. Current device models adopted by SPICE simulators cannot incorporate non-rectangular pattern distortion partly because threshold voltage and leakage current have complex nonlinear relationship with gate shape.

Thus, there exists a need to improve device models to account for sub-wavelength lithographic distortion.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It should be appreciated that like reference numerals are used to identify like elements illustrated in one or more of the figures.

DETAILED DESCRIPTION

It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," or "coupled to" another element or layer, it may be directly on, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

In accordance with an embodiment, the present disclosure relates to a curve-fitting procedure for determining proximity effect device parameters in semiconductor fabrication. In one implementation, the present disclosure relates to determining proximity effect device parameters for non-rectangular semiconductor structures.

Figure 1:
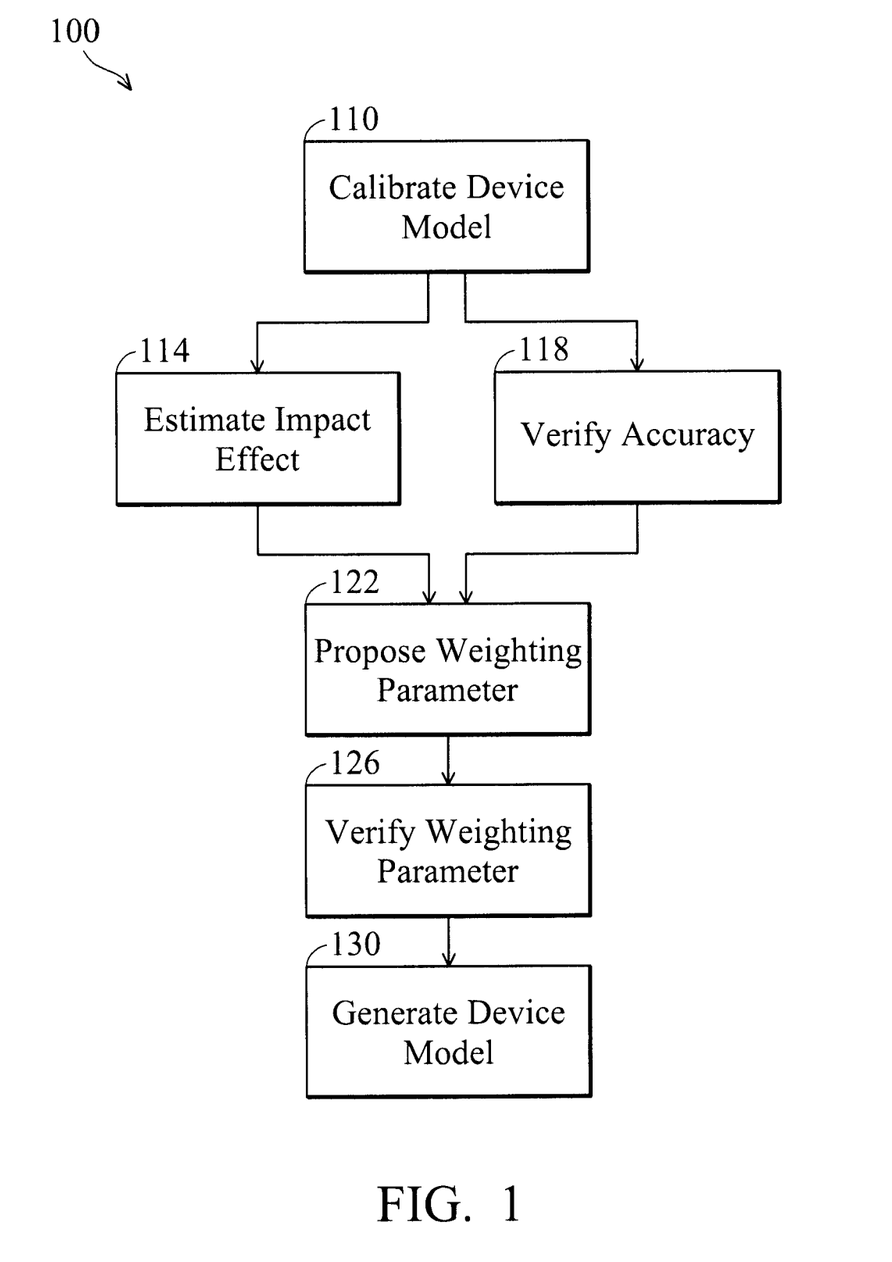
FIG. 1 shows a device simulation process for verifying equivalent gate length (EGL) methods, in accordance with an embodiment of the present disclosure.

FIG. 1 shows a process 100 for device simulation for verifying equivalent gate length (EGL) methods, in accordance with an embodiment of the present disclosure. In one aspect, the process 100 determines the impact of narrow width related edge effects on device characteristics by, for example, comparing two-dimensional (2D) and/or three-dimensional (3D) device simulation. In another aspect, the process 100 determines the accuracy of conventional or standard EGL extraction methods utilizing non-rectangular gate device simulation. In still another aspect, the process 100 includes determining proximity effect device parameters for a semiconductor device, such as a transistor having a non-rectangular gate structure with a contour, curve, or shape that varies in width across the non-rectangular gate structure.

Referring to process 100 of FIG. 1, the device model is provided and calibrated (block 110). In one implementation, the device model is provided for the semiconductor device, and the device model for the semiconductor device is calibrated against a predictive technology model (PTM), such as a 90 nm model. In various aspects, it should be appreciated by those skilled in the art that the device model may be calibrated to any other type of model considered accurate and/or even directly to test results taken from fabricated devices, without departing from the scope of the present disclosure.

The impact effect is estimated (block 114). In one implementation, the impact of narrow width related edge effects on device characteristics is estimated by performing two-dimensional (2D) and three-dimensional (3D) device simulations. For example, the impact of narrow width related edge effects on device characteristics (e.g., ON-current $I_{on}$ and OFF-current $I_{off}$) is estimated by comparing differences of 2D and 3D device simulations. In another example, performing 2D and 3D device simulations includes performing 2D EGL simulation for the device model and 3D non-rectangular gate device simulation for the device model. In one aspect, data provided by 2D device simulations may be provided by test results taken from fabricated devices with device width long enough such that the device length is considerably constant and narrow width related edge effects are negligible. In another aspect, the data provided by 3D device simulations may be provided by test results taken from fabricated devices with considerable non-rectangular gate shapes. In still another aspect, it should be appreciated by those skilled in the art that estimating impact effect may be considered optional, without departing from the scope of the present disclosure.

The accuracy is verified (block 118). In one implementation, accuracy of 2D and/or 3D device simulations is verified. For example, the accuracy of 2D EGL method for $I_{on}$ and $I_{off}$ is verified by evaluating an error between 2D EGL and 3D non-rectangular gate device simulation. In one aspect, it should be appreciated by those skilled in the art that verifying accuracy may be considered optional, without departing from the scope of the present disclosure.

One or more weighting parameters are identified (block 122). In one implementation, one or more weighting parameters are identified and/or proposed for accurate extraction. For example, location-dependent weighting factors are utilized for accurate EGL extraction. In one aspect, weighting parameters may be referred to as weighting factors and/or weighting coefficients. As such, in another aspect, identifying the one or more weighting parameters includes identifying one or more location-dependent weighting factors and/or weighting coefficients for accurate EGL extraction.

One or more weighting parameters are verified (block 126). In one implementation, the one or more weighting parameters comprise one or more weighting factors and/or coefficients that are verified by cross validation. In one aspect, the location-dependent weighting parameters, factors, and/or coefficients are determined from the equations set forth in reference to FIG. 5. In another aspect, it should be appreciated by those skilled in the art that verifying the one or more weighting parameters may be considered optional, without departing from the scope of the present disclosure.

Device model is generated (block 130). In one implementation, generating a device model comprises generating an accurate device model for the semiconductor device based on the one or more verified weighting parameters. In one aspect, generating the accurate device model includes determining proximity effect device parameters for the semiconductor device based on the one or more weighting parameters. In another implementation, generating an accurate device model comprises generating an accurate EGL model for post-lithographic leakage current analysis.

Figure 2:
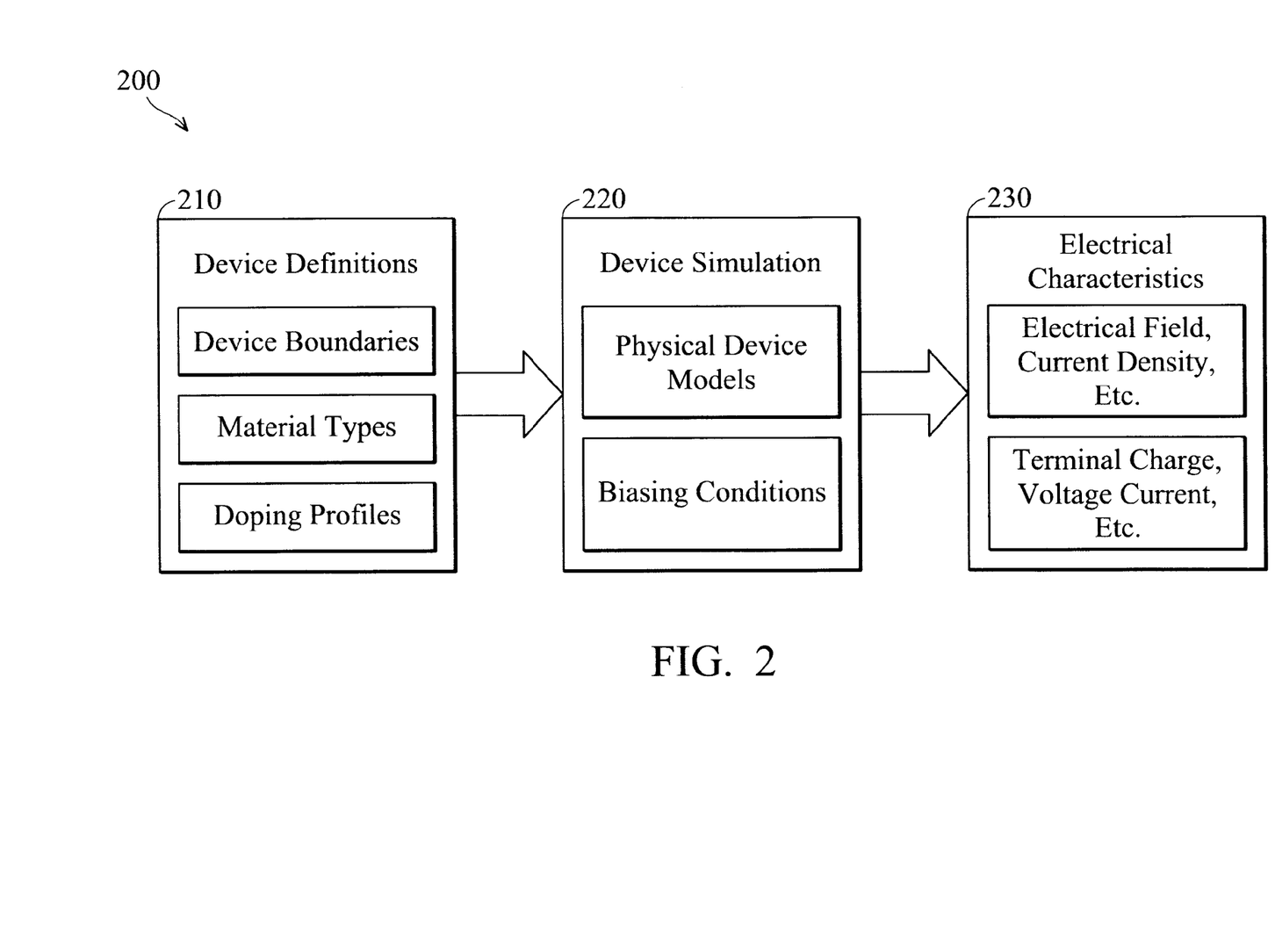
FIG. 2 shows a process for device simulation flow, such as a non-rectangular gate simulation flow, in accordance with an embodiment of the present disclosure.

FIG. 2 shows a process 200 for device simulation flow, such as a non-rectangular gate simulation flow, in accordance with an embodiment of the present disclosure. In one implementation, a device TCAD (i.e., Technology Computer-Aided Design) 3D simulator ISE DESSIS (i.e., Sentaurus Device of Synopsys) is utilized to estimate the impact of narrow width related effects on device characteristics, verify the accuracy of standard EGL methods for non-rectangular transistors, and provide fitting and verification for the EGL extraction method with location-dependent weighting factors. The parameters of a TCAD transistor model may be iteratively tuned to approximately match the PTM at 90 nm node.

Referring to process flow 200 of FIG. 2, device definition 210 of a semiconductor device (e.g., transistor) includes device boundaries, material types, and doping profiles. In one implementation, device definitions 210 are utilized as input for device simulation 220, which generates physical device models and biasing conditions. For non-rectangular gate simulation flow 200, device parameters are defined 210 and may include one or more of length, width, thickness, and concentration for the device.

In another implementation, device simulation 220 generates various electrical characteristics 230 of the physical device models and biasing conditions. The electrical characteristics may include electrical field, current density etc. of the transistor devices. The electrical characteristics may include terminal charge, voltage, current, etc. of the transistor devices. In one aspect, TCAD script contents may be replaced by the defined device parameters, and non-rectangular gate coordinates may be manually inputted.

In one embodiment, $I_{on}$ of 3D device simulation may be slightly larger than 2D simulation. Threshold voltage ($V_{th}$) variation due to narrow-width related effects on on-state current is not quite appreciable since $I_{on}$ is not a very strong function of $V_{th}$. In another aspect, $I_{off}$ of 3D device simulation may be up to three times larger than 2D simulation, partly because $I_{off}$ is an exponential function of $V_{th}$. In still another aspect, narrow-width related effects may become more serious as the channel width decreases.

Figure 3A:
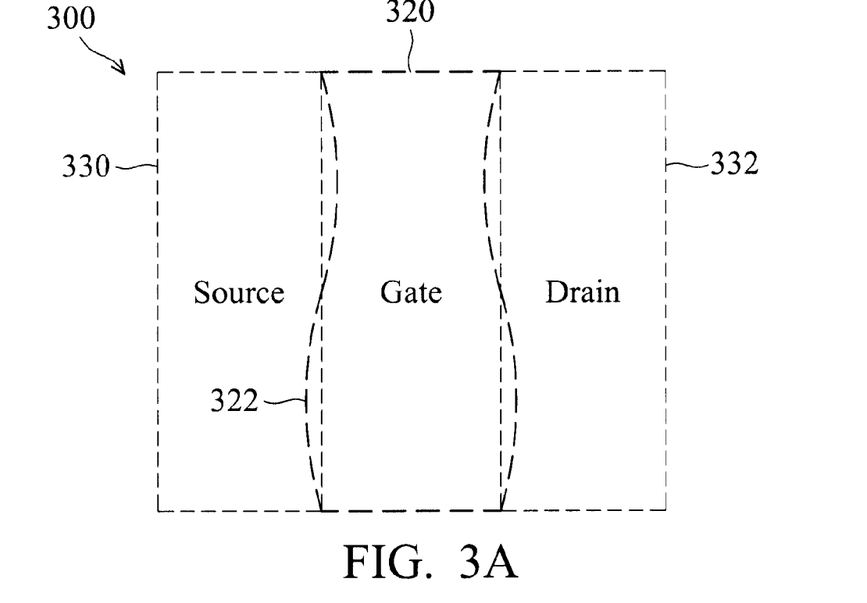
FIG. 3A shows a semiconductor device having a non-rectangular gate structure, in accordance with an embodiment of the present disclosure.

FIG. 3A shows a device 300, such as a transistor, having a non-rectangular gate structure 320 interposed between a source region 330 and a drain region 332, in accordance with an embodiment of the present disclosure. As shown in FIG. 3A, the non-rectangular gate structure 320 comprises a non-rectangular gate contour, curve, or shape 322 that varies in width across the non-rectangular gate structure 320. It should be appreciated that the non-rectangular gate structure 320 may comprise various non-rectangular contours, curves, or shapes without departing from the scope of the present disclosure.

Figure 3B:
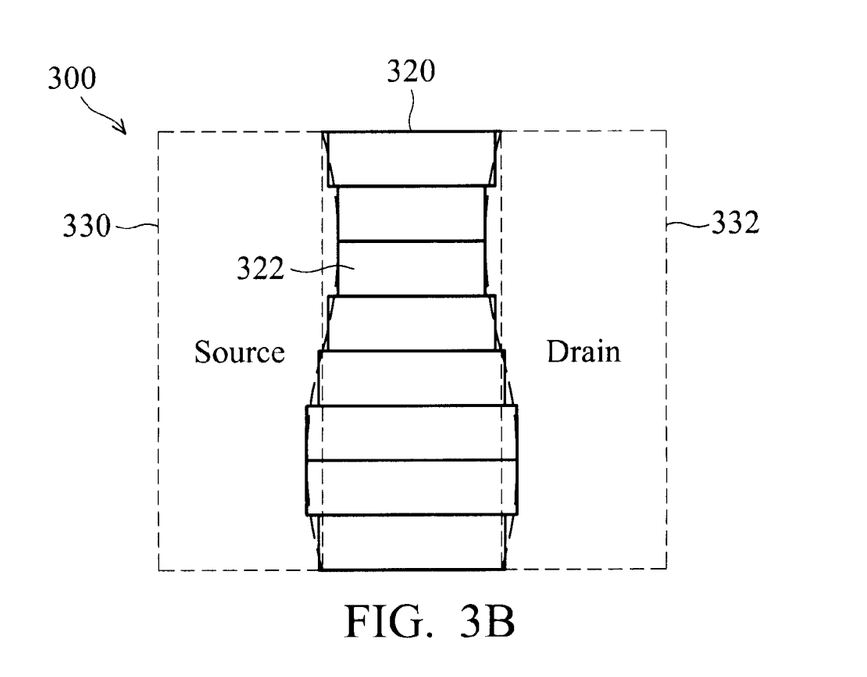
FIG. 3B shows a semiconductor device having a non-rectangular gate structure with a plurality of segmented regions, in accordance with an embodiment of the present disclosure.

FIG. 3B shows the device 300 having the non-rectangular gate structure 320 with a plurality of segmented regions, in accordance with an embodiment of the present disclosure. In one implementation, as shown in FIG. 3B, the segmented regions are stacked adjacent to each other with different lengths that follow the contour, curve, or shape of the non-rectangular gate structure 320. In one aspect, the segmented regions may have a similar height, but the width varies with the contour, curve, or shape 322 of the non-rectangular gate structure 320. In another implementation, the segmented regions may have a variable height along with a variable width depending on the contour, curve, or shape 322 of the non-rectangular gate structure 320.

In one embodiment, the process 100 of FIG. 1 is adapted to imitate the across-gate CD variation due to lithography effects. Each segment of the non-rectangular gate structure 320 may be separately simulated by 2D device simulation. The non-rectangular gate structure 320 may be simulated by 3D device simulation. It should be appreciated that the segmented regions may be referred to as segments or slices without departing from the scope of the present disclosure.

Figure 4:
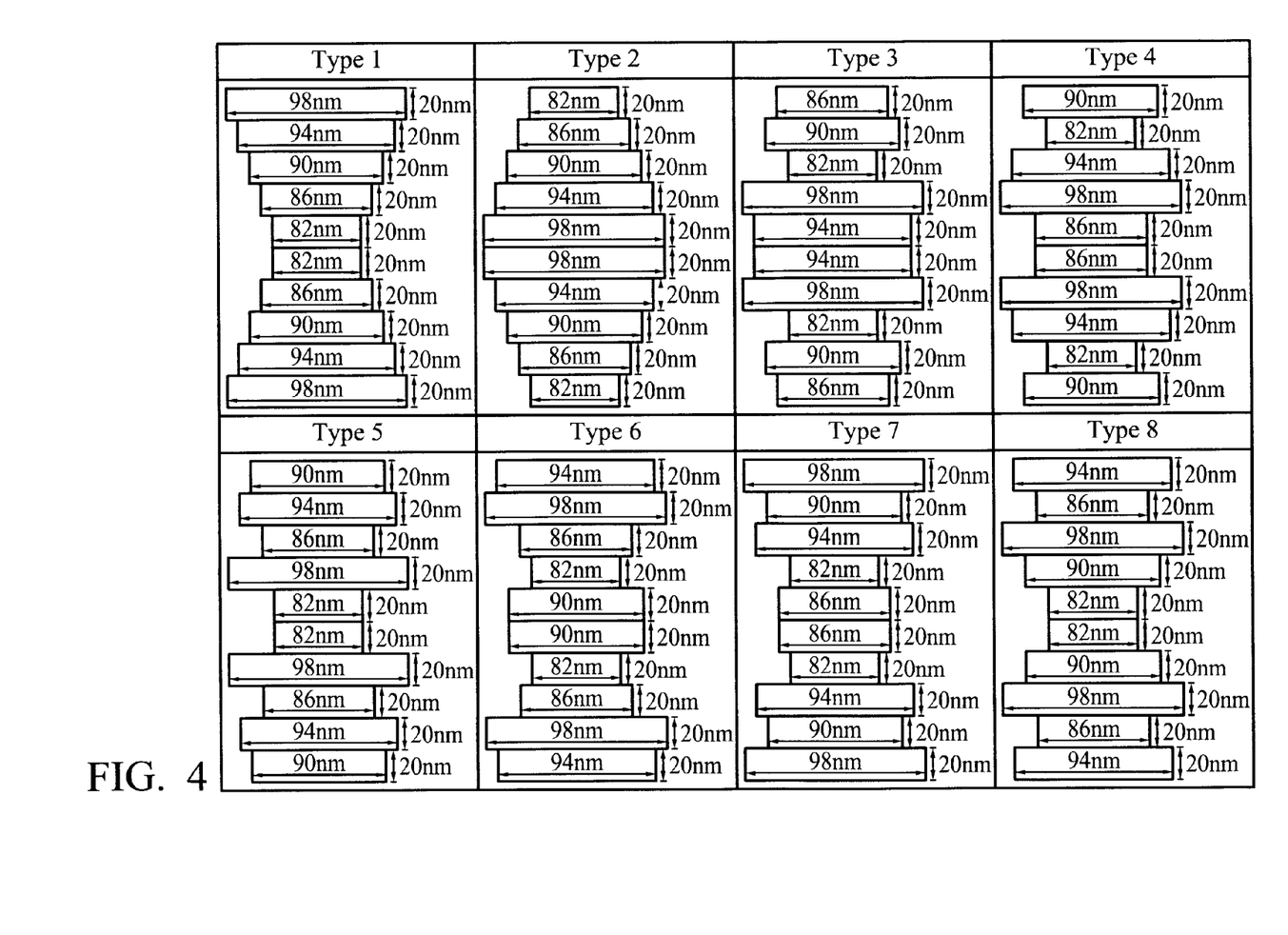
FIG. 4 shows different types of non-rectangular gate structures, in accordance with embodiments of the present disclosure.

FIG. 4 shows a plurality of different types 1-8 of non-rectangular gate structures 320 having varying contours, curves, or shapes, in accordance with one or more embodiments of the present disclosure. As shown in FIG. 4, each non-rectangular gate structure 320 includes a plurality of segmented regions having varying widths according to the contour, curve, or shape of the corresponding non-rectangular gate structures 320, respectively.

In one embodiment, as shown in FIG. 4, each segmented region of each non-rectangular gate structure 320 has a similar width of approximately 20 nm. However, the width of each segmented region may vary between 1 nm and 100 nm without departing from the scope of the present disclosure.

In one embodiment, as shown in FIG. 4, each segmented region of each non-rectangular gate structure 320 has variable lengths dependent on the contour, curve, or shape of each corresponding non-rectangular gate structure 320. In various implementations, the length of each segmented region may vary between 80 nm and 100 nm. However, the length of each segmented region may vary between 1 nm and 200 nm without departing from the scope of the present disclosure.

In one example, as shown in FIG. 4, the non-rectangular gate structures comprise multiple segmented or sliced regions, wherein each non-rectangular gate structure comprises 10 rectangular segments or slices having widths equal to 20 nm and varying lengths of 82 nm, 90 nm, 94, nm, and 98 nm, respectively. As such, eight different contours, curves, or shapes of non-rectangular gate structures may be simulated to generate eight 3D I-V curves.

In one aspect, the ON-state effective gate length ($L_{eff,on}$) well approximates the ON-state characteristics of non-rectangular transistors. However, the $L_{eff,on}$ may not be utilized for determining the OFF-state characteristics. According, embodiments of the present disclosure utilize location-dependent weighting factors to improve accuracy of off-current estimation, as described herein.

Figure 5:
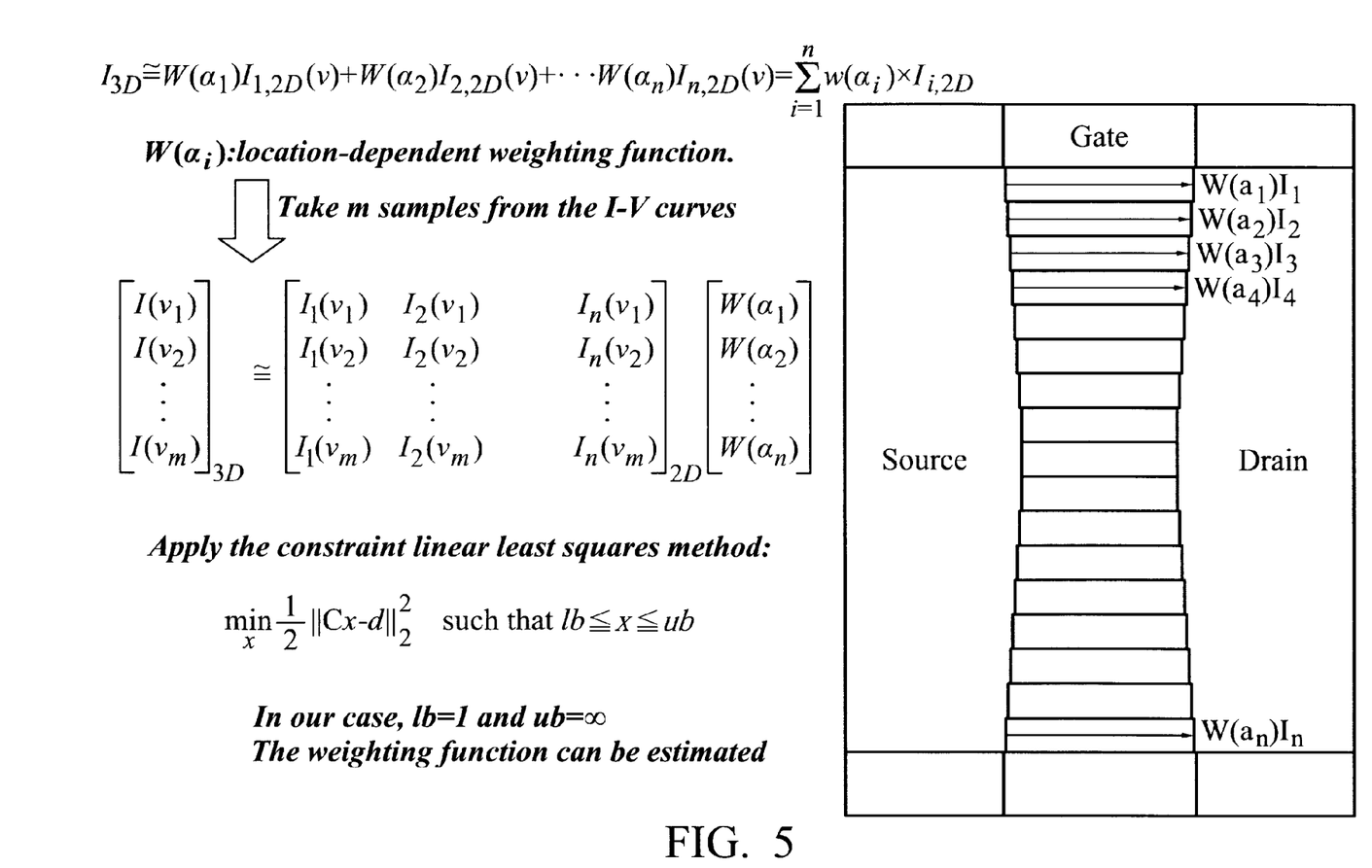
FIG. 5 shows a method for EGL extraction with location-dependent weighting factors, in accordance with embodiments of the present disclosure.

FIG. 5 shows a method for EGL extraction with location-dependent weighting factors, in accordance with one or more embodiments of the present disclosure.

In one implementation, the location-dependent weighting factors may be determined from the following equation:

$$I_{3D} \cong W(\alpha_1)I_{1,2D}(v) + W(\alpha_2)I_{2,2D}(v) + \ldots W(\alpha_n)I_{n,2D}(v) = \sum_{i=1}^{n} w(\alpha_i) \times I_{i,2D}$$

wherein $W(\alpha i)$ comprises a location-dependent weighting function (i.e., weighting factor or weighting coefficient) having a value that may be changed.

Accordingly, a matrix is utilized to approximate by taking m samples from I-V curves with n unknowns:

$$\begin{bmatrix} I(v_1) \\ I(v_2) \\ \vdots \\ I(v_m) \end{bmatrix}_{3D} \cong \begin{bmatrix} I_1(v_1) & I_2(v_1) & \ldots & I_n(v_1) \\ I_1(v_2) & I_2(v_2) & \ldots & I_n(v_2) \\ \vdots & \vdots & \ldots & \vdots \\ I_1(v_m) & I_2(v_m) & \ldots & I_n(v_m) \end{bmatrix}_{2D} \begin{bmatrix} W(\alpha_1) \\ W(\alpha_2) \\ \vdots \\ W(\alpha_n) \end{bmatrix}$$

Next, a linear least squares estimation is formulated, wherein current may be measured to provide an accurate 3D simulation:

$$\min_x \frac{1}{2} \|Cx - d\|_2^2 \text{ such that } lb \le x \le ub$$

wherein C represents the matrix, x represents the weighting factor, d represents a vector for $I(V_m)_{3D}$.

In one aspect, lb=1 and ub=∞ to account for higher current densities near edges. In another aspect, these equations may be solved by quadratic programming: convex; unique, global optimum easily obtained.

In one example, referring to FIG. 4, the eight different types of non-rectangular gate shapes may be 3D-TCAD-simulated to generate eight I-V curves, and weighting factors may be extracted by quadratic programming:

$$\begin{bmatrix} W(\alpha_1) \\ W(\alpha_2) \\ W(\alpha_3) \\ W(\alpha_4) \\ W(\alpha_5) \\ W(\alpha_6) \\ W(\alpha_7) \\ W(\alpha_8) \\ W(\alpha_9) \\ W(\alpha_{10}) \end{bmatrix} = \begin{bmatrix} 7.2682 \\ 4.1188 \\ 2.3130 \\ 2.4057 \\ 2.2441 \\ 2.2441 \\ 2.4057 \\ 2.3130 \\ 4.1188 \\ 7.2682 \end{bmatrix}$$

In one aspect, the relative difference between direct sum of 2D segments and 3D simulation results in about 40%~60%. The weighted sum of 2D segments may approximate the characteristics of 3D non-rectangular transistors. With the extracted weighting factors, the error may be decreased to less than 0.7%. Utilizing location-dependent weighting factors in EGL extraction may improve the accuracy for post-lithography leakage power analysis.

Figure 6:
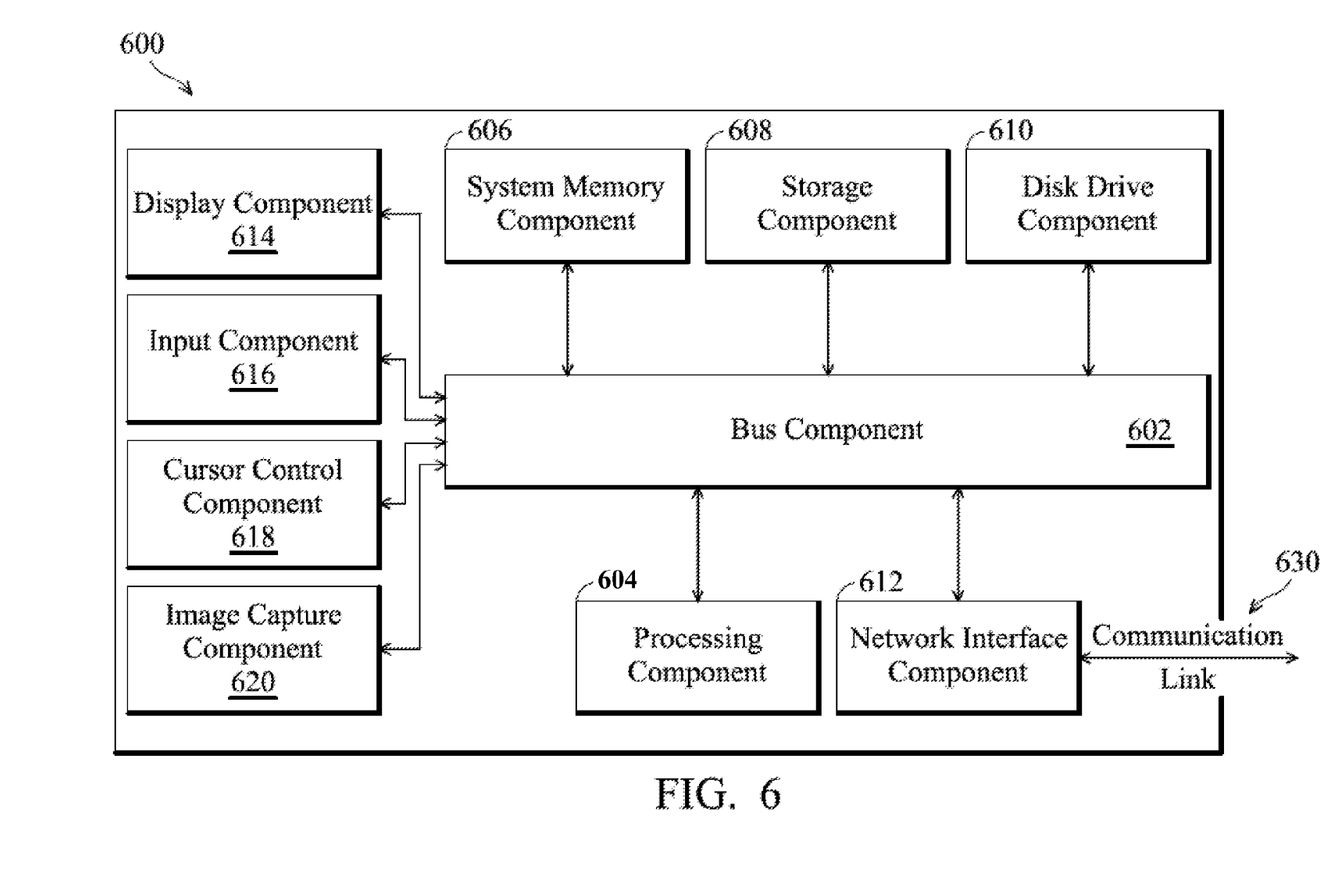
FIG. 6 shows a block diagram of a computer system suitable for implementing one or more embodiments of the present disclosure.

FIG. 6 is a block diagram of a computer system 600 suitable for implementing device simulation, in accordance with embodiments of the present disclosure.

Computer system 600, according to one embodiment, includes a bus 602 or other communication mechanism for communicating information, which interconnects subsystems and components, such as processing component 604 (e.g., processor, micro-controller, digital signal processor (DSP), etc.), system memory component 606 (e.g., RAM), static storage component 608 (e.g., ROM), disk drive component 610 (e.g., magnetic or optical), network interface component 612 (e.g., modem or Ethernet card), display component 614 (e.g., CRT or LCD), input component 616 (e.g., keyboard), cursor control component 618 (e.g., mouse or trackball), and image capture component 620 (e.g., analog or digital camera). In one aspect, disk drive component 610 may comprise a database having one or more disk drive components adapted to store data and information including instructions.

In accordance with embodiments of the present disclosure, computer system 600 performs specific operations by processor 604 executing one or more sequences of one or more instructions comprised by system memory component 606. Such instructions may be read into system memory component 606 from another computer readable medium, such as static storage component 608 or disk drive component 610. In other embodiments, hard-wired circuitry may be utilized in place of or in combination with software instructions to implement embodiments of the present disclosure.

Logic may be encoded in a computer readable medium, which may refer to any medium that participates in providing instructions to processor 604 for execution. Such a medium may take many forms, including but not limited to, non-volatile media and volatile media. In various implementations, non-volatile media includes optical or magnetic disks, such as disk drive component 610, and volatile media includes dynamic memory, such as system memory component 606. In one aspect, data and information related to execution instructions may be transmitted to computer system 600 via a transmission media, such as in the form of acoustic or light waves, including those generated during radio wave and infrared data communications. In various implementations, transmission media may include coaxial cables, copper wire, and fiber optics, including wires that comprise bus 602.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

In various embodiments of the present disclosure, execution of instruction sequences to practice the present disclosure may be performed by computer system 600. In various other embodiments of the present disclosure, a plurality of computer systems 600 coupled by communication link 630 (such as a LAN, WLAN, PTSN, and/or various other wired or wireless networks, including telecommunications, mobile, and cellular phone networks) may perform instruction sequences to practice the present disclosure in coordination with one another.

Computer system 600 may transmit and receive messages, data, information and instructions, including one or more programs (i.e., application code) through communication link 630 and communication interface 612. Received program code may be executed by processor 604 as received and/or stored in disk drive component 610 or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

In accordance with embodiments of the present disclosure, a method for improving device models, as provided herein, includes providing a device model for a semiconductor device, calibrating the device model against a predictive technology model (PTM), identifying one or more weighting parameters for accurate extraction, and generating an accurate device model for the semiconductor device based on the one or more weighting parameters.

In one implementation, the method may include estimating an impact of narrow width related edge effects on the device model by performing two-dimensional (2D) and three-dimensional (3D) device simulations, verifying an accuracy of the 2D and 3D device simulations, and verifying the one or more weighting parameters by cross validation of the verified 2D and 3D device simulations, wherein the accurate device model for the semiconductor device is generated based on the one or more verified weighting parameters.

In accordance with embodiments of the present disclosure, a method for determining proximity effect device parameters for a semiconductor device, as provided herein, includes providing a device model for the semiconductor device, calibrating the device model against a predictive technology model (PTM), estimating impact of narrow width related edge effects on the device model by performing two-dimensional (2D) and three-dimensional (3D) device simulations, verifying accuracy of the 2D and 3D device simulations, identifying one or more weighting parameters for accurate extraction, verifying the one or more weighting parameters by cross validation, and generating an accurate device model for the semiconductor device based on the one or more verified weighting parameters.

In various implementations, the semiconductor device comprises a transistor with a non-rectangular gate structure, and the non-rectangular gate structure comprises a contour, curve, or shape that varies in width across the non-rectangular gate structure. The impact of narrow width related edge effects are estimated on the one or more device characteristics by comparing differences of 2D and 3D device simulations. The device characteristics include ON-current ($I_{on}$) and OFF-current ($I_{off}$) device characteristics. Performing 2D and 3D device simulations includes performing 2D equivalent gate length (EGL) simulation for the device model and 3D non-rectangular gate device simulation for the device model. Verifying accuracy of the 2D and 3D device simulations includes evaluating an error between the 2D EGL simulation and the 3D non-rectangular gate device simulation.

In various implementations, identifying weighting parameters includes segmenting a non-rectangular gate structure of the device model into a plurality of segmented regions. The segmented regions are stacked adjacent to each other with different lengths that follow the contour of the non-rectangular gate structure. The segmented regions have a similar height and the width varies with the contour of the non-rectangular gate structure. Identifying weighting parameters includes identifying location-dependent weighting coefficients for accurate equivalent gate length (EGL) extraction. Verifying the weighting parameters includes verifying weighting coefficients by cross validation. Generating an accurate device model includes generating an accurate EGL model for post-lithographic leakage current analysis of the semiconductor device.

It should be appreciated that like reference numerals are used to identify like elements illustrated in one or more of the figures, wherein showings therein are for purposes of illustrating embodiments of the present disclosure and not for purposes of limiting the same.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method comprising:
providing a device model for a semiconductor device, wherein the device model includes a plurality of sliced gate regions representing a non-rectangular gate structure of the semiconductor device;
calibrating the device model against a predictive technology model (PTM);
after calibrating the device model, estimating an impact of narrow width related edge effects on the calibrated device model by performing two-dimensional (2D) and three-dimensional (3D) device simulations;
after estimating the impact of narrow width related edge effect on the calibrated device model, identifying a plurality of location-dependent weighting parameters for accurate extraction,
   wherein each of the plurality of location-dependent weighting parameters is to be applied to a respective slice of the plurality of sliced gate regions,
   wherein each of the plurality of location-dependent weighting parameters is based on a location of the respective slice within the non-rectangular gate structure,
   wherein the plurality of location-dependent weighting parameters are further based on the impact of narrow width related edge effects, and
   wherein the plurality of location-dependent weighting parameters are identified to improve accuracy of a determination made based on the plurality of sliced gate regions; and
after the identifying of the plurality of location-dependent weighting parameters, generating an accurate device model, by a computer, for the semiconductor device by applying the plurality of location-dependent weighting parameters to the calibrated device model,
   wherein the identifying of the plurality of location-dependent weighting parameters includes identifying the plurality of location-dependent weighting parameters for accurate equivalent gate length (EGL) extraction, and wherein at least one of the plurality of location-dependent weighting parameters is determined from the equation:

$$I_{3D} \cong W(\alpha_1)I_{1,2D}(v) + W(\alpha_2)I_{2,2D}(v) + \ldots W(\alpha_n)I_{n,2D}(v) = \sum_{i=1}^{n} w(\alpha_i) \times I_{i,2D}$$

wherein $W(\alpha_i)$ comprises a location-dependent weighting factor, and
wherein a matrix is utilized to approximate $I_{3D}$ by taking m samples from current-voltage (I-V) curves of the semiconductor device with n unknowns:

$$\begin{bmatrix} I(v_1) \\ I(v_2) \\ \vdots \\ I(v_m) \end{bmatrix}_{3D} \cong \begin{bmatrix} I_1(v_1) & I_2(v_1) & \ldots & I_n(v_1) \\ I_1(v_2) & I_2(v_2) & \ldots & I_n(v_2) \\ \vdots & \vdots & \ldots & \vdots \\ I_1(v_m) & I_2(v_m) & \ldots & I_n(v_m) \end{bmatrix}_{2D} \begin{bmatrix} W(\alpha_1) \\ W(\alpha_2) \\ \vdots \\ W(\alpha_n) \end{bmatrix}.$$

2. The method of claim 1, further comprising:
verifying an accuracy of the 2D and 3D device simulations; and
verifying the plurality of location-dependent weighting parameters by cross validation of the verified 2D and 3D device simulations,
wherein the accurate device model for the semiconductor device is generated based on the verified plurality of location-dependent weighting parameters.

3. The method of claim 2, wherein estimating impact of narrow width related edge effects on the calibrated device model includes estimating the impact of narrow width related edge effects on one or more device characteristics by comparing differences of the 2D device simulation and the 3D device simulation, and wherein the device characteristics include ON-current ($I_{on}$) and OFF-current ($I_{off}$) device characteristics.

4. The method of claim 2, wherein performing 2D and 3D device simulations includes performing 2D equivalent gate length (EGL) simulation for the calibrated device model and 3D non-rectangular gate device simulation for the calibrated device model.

5. The method of claim 4, wherein verifying accuracy of the 2D and 3D device simulations includes evaluating an error between the 2D EGL simulation and the 3D non-rectangular gate device simulation.

6. The method of claim 1, wherein the non-rectangular gate structure comprises a contour that varies in width across the non-rectangular gate structure.

7. The method of claim 1, wherein the gate regions of the plurality of sliced gate regions are stacked adjacent to each other, wherein each of the gate regions has a length that follows the contour of the non-rectangular gate structure, and wherein each of the gate regions have a height and a width that varies with the contour of the non-rectangular gate structure.

8. The method of claim 1, wherein a linear least squares estimation is formulated to provide an accurate 3D simulation:

$$\min_{x} \frac{1}{2}\|Cx - d\|_2^2$$

wherein C represents the matrix, x represents the weighting factor, d represents a vector for $I(v_m)_{3D}$.

9. A method comprising:
providing a device model for a semiconductor device, wherein the device model includes a plurality of gate segments representing a non-rectangular gate structure of the semiconductor device;
calibrating the device model against a predictive technology model (PTM);
after calibrating the device model, estimating an impact of narrow width related edge effects on the calibrated device model by performing two-dimensional (2D) and three-dimensional (3D) device simulations;
after estimating the impact of narrow width related edge effects on the calibrated device model, verifying an accuracy of the 2D and 3D device simulations;
after verifying the accuracy of the 2D and 3D device simulations, identifying a plurality of location-dependent weighting parameters for accurate extraction,
   wherein each of the plurality of location-dependent weighting parameters is to be applied to a respective segment of the plurality of gate segments, wherein each of the plurality of location-dependent weighting parameters is based on a location of the respective segment within the non-rectangular gate structure, wherein the plurality of location-dependent weighting parameters are further based on the verified 2D and 3D device simulations, and wherein each of the plurality of location-dependent weighting parameters is identified to improve a determination made using the respective gate segment of the plurality of gate segments based on the impact of narrow width related edge effects;

after identifying the plurality of location-dependent weighting parameters, verifying the plurality of location-dependent weighting parameters by cross validation of the verified 2D and 3D device simulations;

after verifying the plurality of location-dependent weighting parameters, determining proximity effect device parameters for the semiconductor device based on the verified plurality of location-dependent weighting parameters; and after determining proximity effect device parameters for the semiconductor device, generating an accurate device model, by a computer, for the semiconductor device based on the determined proximity effect device parameters, wherein the identifying of the plurality of location-dependent weighting parameters includes identifying the plurality of location-dependent weighting parameters for accurate equivalent gate length (EGL) extraction, and wherein at least one of the plurality of location-dependent weighting parameters is determined from the equation:

$$I_{3D} \cong W(\alpha_1)I_{1,2D}(v) + W(\alpha_2)I_{2,2D}(v) + \ldots W(\alpha_n)I_{n,2D}(v) = \sum_{i=1}^{n} w(\alpha_i) \times I_{i,2D}$$

wherein $W(\alpha_1)$ comprises a location-dependent weighting factor, and wherein a matrix is utilized to approximate $I_{3D}$ by taking m samples from current-voltage (I-V) curves of the semiconductor device with n unknowns:

$$\begin{bmatrix} I(v_1) \\ I(v_2) \\ \vdots \\ I(v_m) \end{bmatrix}_{3D} \cong \begin{bmatrix} I_1(v_1) & I_2(v_1) & \ldots & I_n(v_1) \\ I_1(v_2) & I_2(v_2) & \ldots & I_n(v_2) \\ \vdots & \vdots & \ldots & \vdots \\ I_1(v_m) & I_2(v_m) & \ldots & I_n(v_m) \end{bmatrix}_{2D} \begin{bmatrix} W(\alpha_1) \\ W(\alpha_2) \\ \vdots \\ W(\alpha_n) \end{bmatrix}.$$

10. The method of claim 9, wherein the non-rectangular gate structure comprises a contour that varies in width across the non-rectangular gate structure.

11. The method of claim 9, wherein the estimating of the impact of narrow width related edge effects on the calibrated device model includes estimating the impact of narrow width related edge effects on one or more device characteristics by comparing differences of the 2D device simulation and the 3D device simulation, and wherein the device characteristics include ON-current ($I_{on}$) and OFF-current ($I_{off}$) device characteristics.

12. The method of claim 9, wherein:
performing 2D and 3D device simulations includes performing 2D equivalent gate length (EGL) simulation for the calibrated device model and 3D non-rectangular gate device simulation for the calibrated device model, and verifying accuracy of the 2D and 3D device simulations includes evaluating an error between the 2D EGL simulation and the 3D non-rectangular gate device simulation.

13. The method of claim 9, wherein the plurality of gate segments are stacked adjacent to each other, wherein each of the plurality of gate segments has a length that follows the contour of the non-rectangular gate structure, and wherein each of the plurality of gate segments has a height and a width that varies with the contour of the non-rectangular gate structure.

14. The method of claim 9, wherein a linear least squares estimation is formulated to provide an accurate 3D simulation:

$$\min_{x} \frac{1}{2} \|Cx - d\|_2^2$$

wherein C represents the matrix, x represents the weighting factor, d represents a vector for $I(v_m)_{3D}$.

15. The method of claim 9, wherein:
verifying the plurality of location-dependent weighting parameters includes verifying the plurality of location-dependent weighting parameters by cross validation of the verified 2D and 3D device simulations, and generating an accurate device model includes generating an accurate EGL model for post-lithographic leakage current analysis of the semiconductor device.

16. A method performed by a computer system, the method comprising:
constructing a device model for a transistor having a non-rectangular gate structure, wherein the device model includes a plurality of sliced gate regions representing the non-rectangular gate structure;

estimating an impact of a narrow width related edge effect on the device model;

identifying a plurality of weighting parameters for accurate equivalent gate length (EGL) extraction to correct for the estimated impact of the narrow width related edge effects, wherein each parameter of the plurality of weighting parameters is to be applied to a 2D device simulation of one of the plurality of sliced gate regions such that a weighted sum of 2D device simulations of the plurality of sliced gate regions approximates a 3D device simulation of the non-rectangular gate structure, wherein each parameter of the plurality of weighting parameters is based on a location within the non-rectangular gate structure of the one of the plurality of sliced gate regions to which it is to be applied, and wherein at least two parameters of the plurality of weighting parameters have different values; and constructing a modified device model based on the device model and the plurality of weighting parameters, wherein at least one of the plurality of weighting parameters is determined from the equation:

$$I_{3D} \cong W(\alpha_1)I_{1,2D}(v) + W(\alpha_2)I_{2,2D}(v) + \ldots W(\alpha_n)I_{n,2D}(v) = \sum_{i=1}^{n} w(\alpha_i) \times I_{i,2D}$$

wherein $W(\alpha_i)$ comprises a weighting factor, and
wherein a matrix is utilized to approximate $I_{3D}$ by taking m samples from current-voltage (I-V) curves of the transistor with n unknowns:

$$\begin{bmatrix} I(v_1) \\ I(v_2) \\ \vdots \\ I(v_m) \end{bmatrix}_{3D} \cong \begin{bmatrix} I_1(v_1) & I_2(v_1) & \ldots & I_n(v_1) \\ I_1(v_2) & I_2(v_2) & \ldots & I_n(v_2) \\ \vdots & \vdots & \ldots & \vdots \\ I_1(v_m) & I_2(v_m) & \ldots & I_n(v_m) \end{bmatrix}_{2D} \begin{bmatrix} W(\alpha_1) \\ W(\alpha_2) \\ \vdots \\ W(\alpha_n) \end{bmatrix}.$$

17. The method of claim 16, wherein the non-rectangular gate structure varies in height along with a variable width and wherein the plurality of sliced gate regions of the device model account for a variation in height of the non-rectangular gate structure.

18. The method of claim 16, further comprising:
verifying the plurality of weighting parameters by cross validation of the 2D and 3D device simulations.

19. The method of claim 18, wherein the modified device model is further based on the verified plurality of weighting parameters.

20. The method of claim 16, wherein a linear least squares estimation is formulated to provide an accurate 3D simulation:

$$\min_x \frac{1}{2} \|Cx - d\|_2^2$$

wherein C represents the matrix, x represents the weighting factor, d represents a vector for $I(v_m)_{3D}$.

* * * * *